(12) United States Patent
Shin

(10) Patent No.: US 12,635,352 B2
(45) Date of Patent: May 19, 2026

(54) LIGHT EMITTING DISPLAY APPARATUS INCLUDING BANK WITH PROTRUSION

(71) Applicant: LG Display Co., Ltd., Seoul (KR)

(72) Inventor: Hyeon-Hoon Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 362 days.

(21) Appl. No.: 18/346,066

(22) Filed: Jun. 30, 2023

(65) Prior Publication Data

US 2024/0040850 A1 Feb. 1, 2024

(30) Foreign Application Priority Data

Jul. 29, 2022 (KR) ........................ 10-2022-0094561

(51) Int. Cl.
*H10K 59/122* (2023.01)
*H10K 59/123* (2023.01)
*H10K 59/126* (2023.01)
*H10K 59/131* (2023.01)
*H10K 59/35* (2023.01)
(Continued)

(52) U.S. Cl.
CPC ......... *H10K 59/122* (2023.02); *H10K 59/123* (2023.02); *H10K 59/126* (2023.02); *H10K 59/131* (2023.02); *H10K 59/352* (2023.02); *H10K 59/353* (2023.02); *H10K 59/38* (2023.02); *H10K 59/40* (2023.02); *H10K 59/351* (2023.02)

(58) Field of Classification Search
CPC .. H10K 59/122; H10K 59/123; H10K 59/126; H10K 59/131; H10K 59/352; H10K 59/353; H10K 59/38; H10K 59/40
See application file for complete search history.

(56) References Cited

U.S. PATENT DOCUMENTS 9,281,491 B2 3/2016 Kum et al.
9,627,457 B2 4/2017 Lee
(Continued)

FOREIGN PATENT DOCUMENTS

EP 4024470 A1 7/2022
EP 4271161 A1 11/2023
(Continued)

OTHER PUBLICATIONS

US 11,925,069 B2, 03/2024, Koo et al. (withdrawn)
Kim KR20210083004 machine translation (Year: 2021).*
Lee et al., WO2020050467A1, machine translation (Year: 2020).*

*Primary Examiner* — Tracie Y Green
(74) *Attorney, Agent, or Firm* — Seed Intellectual Property Law Group LLP

(57) ABSTRACT

A display apparatus includes a substrate including emitting portions and a non-emitting portion between the emitting portions, a first subpixel and a second subpixel disposed at the light emitting portions, first electrodes respectively disposed at the first subpixel and the second subpixel and disposed on the substrate, a bank disposed on the first electrodes and disposed at the non-emitting portion and including at least one protrusion protruded on an upper surface of the bank, a light emitting element layer disposed on the first electrodes of the emitting portions and the non-emitting portion and the bank, and including a plurality of light emitting units and a charge generation layer between the plurality of light emitting units, and a second electrode disposed on the light emitting element layer.

20 Claims, 7 Drawing Sheets

(51) Int. Cl.
H10K 59/38 (2023.01)
H10K 59/40 (2023.01)

(56) References Cited

U.S. PATENT DOCUMENTS

| | | | |
|---|---|---|---|
| 10,996,803 | B2 | 5/2021 | Son et al. |
| 11,768,550 | B2 | 9/2023 | Lee et al. |
| 2012/0097927 | A1 | 4/2012 | Shin |
| 2013/0228769 | A1 | 9/2013 | Zhou et al. |
| 2018/0062106 | A1 | 3/2018 | Heo et al. |
| 2019/0357335 | A1 | 11/2019 | Tsuchi |
| 2020/0373520 | A1 | 11/2020 | Kim et al. |
| 2020/0388658 | A1 | 12/2020 | Tsaur et al. |
| 2021/0159445 | A1 | 5/2021 | Sim et al. |
| 2021/0257349 | A1 | 8/2021 | Yang et al. |
| 2022/0005874 | A1 | 1/2022 | Oh et al. |
| 2022/0052135 | A1 | 2/2022 | Heo et al. |
| 2022/0139319 | A1* | 5/2022 | Oh ...................... H01L 25/0753 345/204 |
| 2022/0199691 | A1 | 6/2022 | Shin et al. |
| 2022/0199715 | A1 | 6/2022 | Kim et al. |
| 2023/0345766 | A1* | 10/2023 | Lee ........................ H10K 59/10 |
| 2024/0177675 | A1* | 5/2024 | Li ........................ G09G 3/3275 |

FOREIGN PATENT DOCUMENTS

| | | | |
|---|---|---|---|
| EP | 3910682 | B1 | 4/2025 |
| JP | 2009238456 | A | 10/2009 |
| JP | 2013545249 | A | 12/2013 |
| JP | 2015015241 | A | 1/2015 |
| JP | 2015130335 | A | 7/2015 |
| JP | 2018110096 | A | 7/2018 |
| JP | 2019159355 | A | 9/2019 |
| JP | 2021197370 | A | 12/2021 |
| JP | 2022105260 | A | 7/2022 |
| KR | 20170015829 | A | 2/2017 |
| KR | 20190064198 | A | 6/2019 |
| KR | 20200076278 | A | 6/2020 |
| KR | 20210083004 | A | 7/2021 |
| WO | 2018212960 | A1 | 11/2018 |
| WO | WO-2020050467 | A1 * | 3/2020 ............ H10D 66/40 |
| WO | 2021154693 | A1 | 8/2021 |
| WO | 2022003352 | A1 | 1/2022 |
| WO | 2022124535 | A1 | 6/2022 |

* cited by examiner

LIGHT EMITTING DISPLAY APPARATUS INCLUDING BANK WITH PROTRUSION

CROSS REFERENCE TO RELATED APPLICATIONS

The present application claims the priority benefit of Korean Patent Application No. 10-2022-0094561 filed in Republic of Korea on Jul. 29, 2022, which is hereby incorporated by reference in its entirety for all purposes as if fully set forth herein.

BACKGROUND

Technical Field

The present disclosure relates to a light emitting display apparatus.

Description of the Related Art

Recently, with development of multimedia, an importance of a flat display apparatus has increased. In response to this, flat display apparatuses such as a liquid crystal display apparatus, a plasma display apparatus, and an organic electroluminescent display apparatus have been commercialized. Among these flat display apparatuses, an organic electroluminescent display apparatus is currently widely used in that it has a high response speed, a high luminance and a good viewing angle.

Various sizes, various shapes, and various functions are required for recent display apparatuses capable of displaying various types of information and interacting with users who watch the corresponding information.

Such display apparatuses include a liquid crystal display apparatus, an electrophoretic display apparatus, and a light emitting diode display apparatus.

The light emitting display apparatus is a self-emitting display apparatus and, unlike a liquid crystal display apparatus, does not require a separate light source and can be manufactured to be lightweight and thin. In addition, the light emitting display apparatus is not only advantageous in terms of power consumption due to low voltage driving, but is also excellent in color implementation, response speed, viewing angle, and contrast ratio (CR), so that it has been studied as next-generation display apparatus.

Although an explanation is made on the assumption that the light emitting display apparatus is an organic light emitting display apparatus, a type of a light emitting element layer is not limited thereto.

The light emitting display apparatus displays information on a screen by emitting light from a plurality of pixels including a light emitting element layer having a light emitting layer, and can be divided into an active matrix type light emitting display apparatus and a passive matrix type light emitting display apparatus according to a method of driving the pixels.

The active matrix type light emitting display apparatus displays an image by controlling a current flowing through a light emitting diode using a thin film transistor (TFT).

The light emitting display apparatus has an anode, a light emitting layer, and a cathode. When voltages are respectively applied to the anode and the cathode, holes from the anode and electrons from the cathode move to the light emitting layer. When the holes and electrons are combined in the light emitting layer, excitons are formed in an excitation process, and light is generated due to energy from the excitons.

In order to provide high-quality image information, a resolution of the light emitting display apparatus is gradually increasing.

BRIEF SUMMARY

The disclosure provides a light emitting display apparatus having a structure for preventing leakage current between neighboring subpixels. The present disclosure solves, among others, visibility defect due to leakage current between neighboring subpixels caused by the narrowing of a distance between subpixels at high resolution, and relates to a light emitting display apparatus that improves a color reproduction rate by blocking the leakage current generated between neighboring subpixels.

As the resolution of a light emitting display apparatus increases, a separation distance between subpixels becomes narrower. The inventors recognized that there is a problem in that image information is distorted by a current leaking in a lateral direction between neighboring subpixels. The present disclosure is directed to a light emitting display apparatus that, among others, substantially obviates one or more of the problems of current leaking.

The present disclosure provides a light emitting display apparatus which includes a bank having at least one protrusion to block a lateral leakage current that increases as a distance between neighboring subpixels decreases.

The present disclosure provides a light emitting display apparatus which increases a distance that electrons move to neighboring subpixels by arranging a light emitting element layer along an unevenness formed at an upper portion of a bank, which prevents electrons formed inside a light emitting element layer from moving to neighboring pixels.

The present disclosure provides a light emitting display apparatus which solves a visibility defect in which a neighboring subpixel emits light in a low gray level, and includes a structure for blocking a lateral leakage current, which improves a color reproduction rate.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

A display apparatus includes a substrate including emitting portions and a non-emitting portion between the emitting portions, a first subpixel and a second subpixel disposed at the light emitting portions, first electrodes respectively disposed at the first subpixel and the second subpixel and disposed on the substrate, a bank disposed on the first electrodes and disposed at the non-emitting portion and including at least one protrusion protruded on an upper surface of the bank, a light emitting element layer disposed on the first electrodes of the emitting portions and the non-emitting portion and the bank, and including a plurality of light emitting units and a charge generation layer between the plurality of light emitting units, and a second electrode disposed on the light emitting element layer.

It is to be understood that both the foregoing general description and the following detailed description are examples and explanatory.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
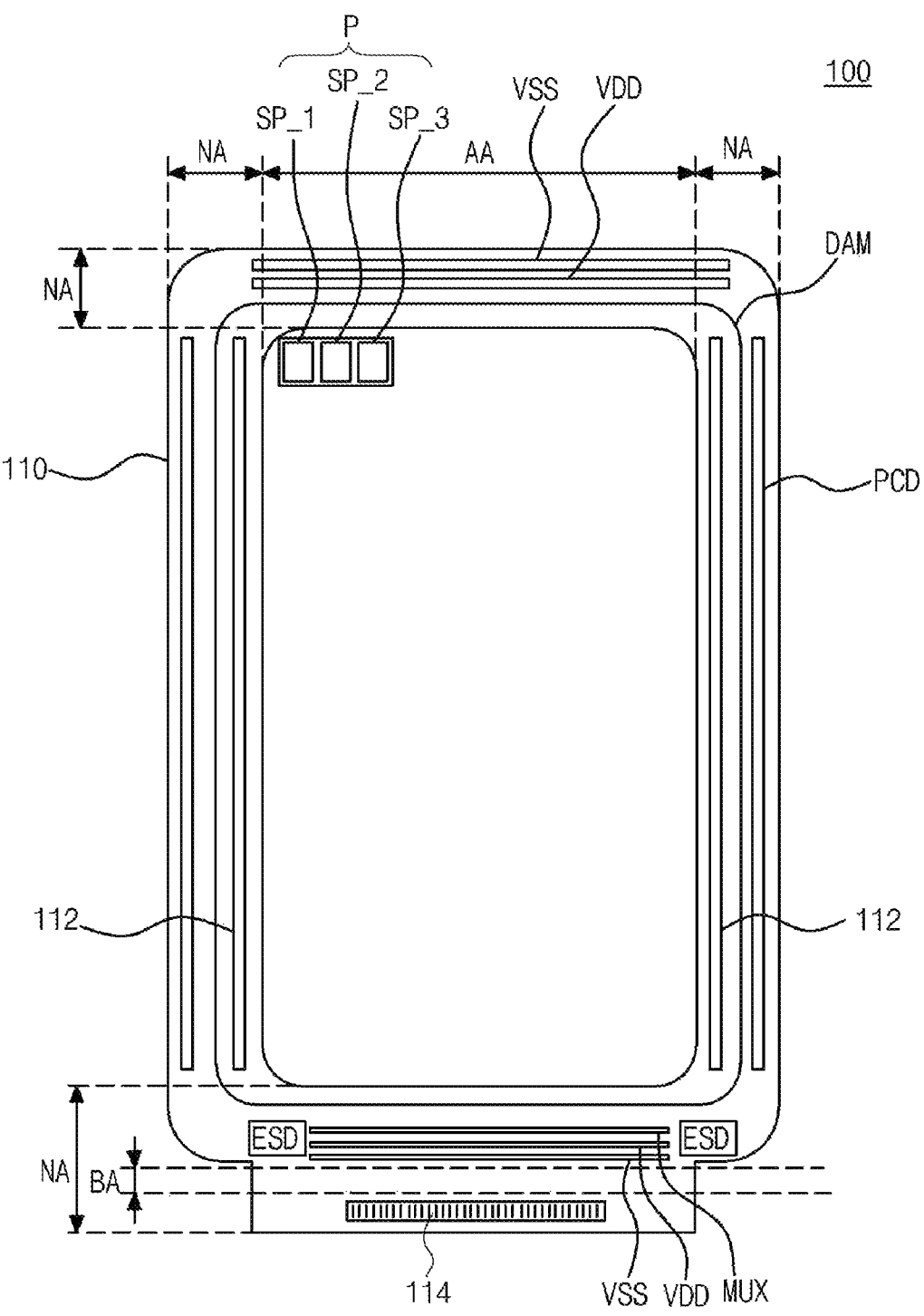
FIG. 1 is a plan view of a light emitting display apparatus according to an embodiment of the present disclosure.

Technical benefits and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present disclosure.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof can be omitted. When 'comprising', 'including', 'having', 'consisting', and the like are used in this disclosure, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below','beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

Respective features of various embodiments of the present disclosure can be partially or wholly connected to or combined with each other and can be technically interlocked and driven variously, and respective embodiments can be independently implemented from each other or can be implemented together with a related relationship.

In describing components of the present disclosure, terms such as first, second, A, B, (a), (b) and the like can be used. These terms are only for distinguishing the components from other components, and an essence, order, order, or number of the components is not limited by the terms. Further, when it is described that a component is "connected," "coupled" or "contact" to another component, the component can be directly connected or contact the another component, but it should be understood that other component can be "interposed" between the components.

"At least one" should be understood to include all combinations of one or more of associated components. For example, meaning of "at least one of first, second, and third components" means not only the first, second, or third component, but also all combinations of two or more of the first, second and third components.

In this disclosure, an "apparatus" can include a display apparatus, such as a liquid crystal module (LCM), an organic light emitting display module (OLED module) or the like, including a display panel and a driving portion for driving the display panel. Furthermore, the "apparatus" can include a complete product or final product which is a notebook computer, a television, a computer monitor, an automotive device or equipment display including other type of vehicle, or a set electronic device or set device or set apparatus such as a mobile electronic device which is a smart phone, an electronic pad or the like, including the LCM, OLED module or the like.

Therefore, the apparatus of this disclosure can include a display apparatus itself such as the LCM, OLED or the like, and/or an application product or a set device that is an end-user device, including the LCM, OLED module or the like.

Further, in some embodiments, the LCM, OLED module or the like configured with a display panel and a driving portion can be expressed as a "display apparatus," and an electronic apparatus as a final product including the LCM, OLED module or the like may be distinguished and expressed as a "set device." For example, the display apparatus can include a liquid crystal or organic light emitting diode (OLED) display panel, and a source PCB that is a control portion for driving the display panel. The set device can further include a set PCB which is a set control portion electrically connected to the source PCB to drive the entire set device.

The display panel used in embodiments of the present disclosure can use all types of display panels such as a liquid crystal display panel, an organic light emitting diode (OLED) display panel, and an electro-luminescent display panel, but the embodiments are not limited thereto. For example, the display panel can be a display panel capable of generating sound by being vibrated by a vibrating device according to embodiments of the present disclosure. The display panel applied to the display apparatus according to embodiments of the present disclosure is not limited to a shape or size of the display panel.

Features of various embodiments of the present disclosure can be partially or wholly combined with each other, technically various interlocking and driving thereof are possible, and embodiments can be implemented independently from each other or can be implemented together in a related relationship.

Hereinafter, embodiments of the present disclosure are described with reference to accompanying drawings. Scales of components shown in the drawings may be different from scales of actual components for convenience of description, and thus are not limited to sizes shown in the drawings.

Hereinafter, various embodiments of the present disclosure are be described in detail with reference to drawings.

Figure 2:
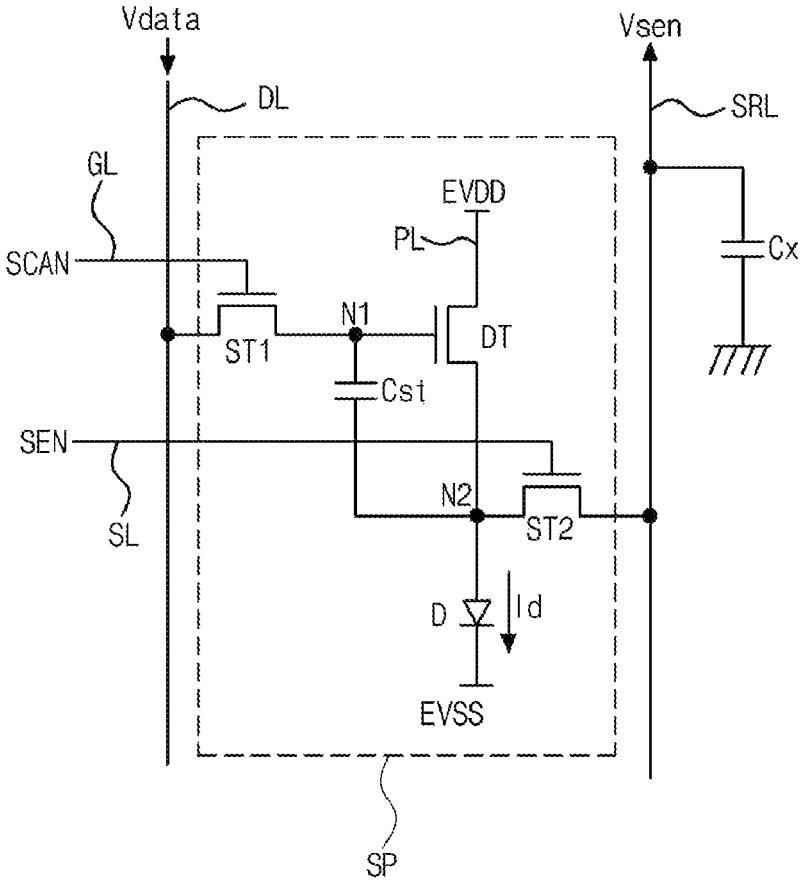
FIG. 2 is a circuit diagram of a subpixel of a light emitting display apparatus according to an embodiment of the present disclosure.

FIG. 1 is a plan view of a light emitting display apparatus according to an embodiment of the present disclosure. FIG. 2 is a circuit diagram of a subpixel of a light emitting display apparatus according to an embodiment of the present disclosure.

Referring to FIGS. 1 and 2, the light emitting display apparatus 100 may include various additional elements for generating various signals or driving a plurality of subpixels SP in an active area (or a display area) AA. For example, one or more driving circuits for controlling a display panel may be included in the light emitting display apparatus 100. The driving circuit for controlling (or driving) the subpixels SP may include a gate driver, data signal lines, a multiplexer MUX, an electro static discharge circuit portion ESD, a high potential voltage line VDD, a low potential voltage line VSS, an inverter circuit, and the like. The light emitting display apparatus 100 may also include additional elements other than functions for driving the subpixels SP. For example, the light emitting display apparatus 100 may include additional elements providing a touch sensing function, a user authentication function (e.g., fingerprint recognition), a multi-level pressure sensing function, a tactile feedback function, and the like. The aforementioned additional elements may be located in a non-active area (or a non-display area) NA or an external circuit connected to the connection interface.

A substrate 110 may include the active area AA and the non-active area NA. The active area AA of the substrate 110 may be an area where a plurality of pixels P are disposed to display an image. The non-active area NA of the substrate 110 may be an area on which an image is not displayed. For example, the non-active area NA may be a bezel area but is not limited to the term. The non-active area NA may be adjacent to the active area AA and disposed outside the active area AA. Alternatively, the non-active area NA may be disposed to surround all or part of the active area AA. Alternatively, the non-display area NA may be an area in which the plurality of subpixels SP are not disposed, but is not limited thereto.

The pixel P disposed in the active area AA may include the plurality of subpixels SP. The subpixel SP is an individual unit that emits light, and the plurality of subpixels SP may include a first subpixel SP_1, a second subpixel SP_2, a third subpixel SP_3, and/or a white subpixel, but are not limited thereto.

Each subpixel SP may be formed with a light emitting element, for example, an organic light emitting diode, and a driving circuit. For example, a display element for displaying an image and a driving circuit for driving (or controlling) the display element may be disposed in the plurality of subpixels SP.

One subpixel SP may include a plurality of transistors, at least one capacitor, and a plurality of lines (or wires). For example, the subpixel SP may include two transistors and one capacitor, which is a 2T1C structure, but is not limited thereto, and may have a structure of 3T1C, 4T1C, 5T1C, 6T1C, 7T1C, 3T2C, 4T2C, 5T2C, 6T2C, 7T2C, 8T2C, or the like.

The non-active area NA may be an area where various lines, driving circuits, etc., for driving the plurality of subpixels SP disposed in the active area AA are disposed. For example, various ICs and driving circuits such as a gate driver and a data driver may be disposed in the non-active area NA.

Although FIG. 1 shows that the non-active area NA surrounds the rectangular active area AA, the shape of the active area AA, and the shape and arrangement of the non-active area NA adjacent to the active area AA is not limited to the example shown in FIG. 1. The active area AA and the non-active area NA may have shapes suitable for a design of an electronic device in which the light emitting display apparatus 100 is mounted. In the case of a display apparatus of a wearable device by a user, it may have a circular shape like a general wrist watch, and the concepts of the embodiments of the present disclosure may also be applied to a free-form display apparatus applicable to a vehicle dashboard. An example shape of the active area AA may be pentagonal, hexagonal, octagonal, circular, elliptical, or the like, but is not limited thereto.

A bending area BA may be provided in a portion of the non-active area NA. The bending area BA may be provided between the active area AA and a pad portion 114 located in the non-active area NA. Also, the bending area BA may be an area in which a connection wiring portion (or connection line portion) is formed.

The bending area BA may be an area in which a portion of the substrate 110 is bent in order to dispose the pad portion 114 and an external module bonded to the pad portion 114 on a rear surface of the substrate 110. For example, as the bending area BA is bent toward the rear surface of the substrate 110, the external module bonded to the pad portion 114 of the substrate 110 moves toward the rear surface of the substrate 110, and the external module may not be recognized when viewed from above the substrate 110. Also, as the bending area BA is bent, a size of the non-active area NA recognized from above the substrate 110 is reduced, so that a narrow bezel can be implemented. In the present disclosure, it is illustrated that the bending area BA is present in the non-active area NA, but is not limited thereto. For example, the bending area BA may be located in the active area AA, and the active area AA itself may be bent in various directions so that the bending area BA located in the active area AA may also have the effects mentioned in the present disclosure.

The pad portion 114 may be disposed at one side of the non-active area NA. The pad portion 114 may be a metal pattern to which the external module, for example, a flexible printed circuit board (FPCB), a chip on film (COF) or the like is bonded. Although the pad portion 114 is illustrated as being disposed at one side of the substrate 110, the shape and arrangement of the pad portion 114 are not limited thereto.

A gate driver 112 providing a gate signal to a thin film transistor may be disposed at another side of the non-active area NA. The gate driver 112 may include various gate driving circuits, and the gate driving circuits may be directly formed on the substrate 110. In this case, the gate driver 112 may be a gate-in-panel (GIP) type driver.

The gate driver 112 may be disposed between the active area AA and a dam DAM disposed in the non-active area NA of the substrate 110.

The high potential voltage line VDD, the low potential voltage line VSS, the multiplexer MUX, and the electrostatic discharge circuit portion ESD, and a plurality of connection wiring portions may be disposed between the active area AA and the pad portion 114 in the non-active area NA.

The high potential voltage line VDD, the low potential voltage line VSS, the multiplexer MUX, and the electrostatic discharge circuit portion ESD may be disposed between the active area AA and the bending area BA.

The connection wiring portion may be disposed in the non-active area NA. For example, the connection wiring portion may be disposed in the bending area BA where the substrate 110 is bent among the non-active area NA. The connection wiring portion may be a component to transfer a signal (or voltage) from the external module bonded to the pad portion 114 to the active area AA or a circuit portion such as the gate driver 112. For example, various signals such as signals for driving the gate driver 112, data signals, a high potential voltage, and a low potential voltage may be transferred through the connection wiring portion.

The dam DAM may be disposed in the non-active area NA to surround all or part of the active area AA. The dam DAM may be disposed adjacent to the active area AA and outside the active area AA.

The dam DAM may be disposed along a peripheral portion of the active area AA in order to control flow of an organic layer which is a material of a second encapsulation layer among encapsulation layers disposed on a light emitting element layer. A number of dam DAM may one or a plurality.

The dam DAM may be disposed between the active area AA, and a high potential voltage line VDD, a low potential voltage line VSS, a multiplexer MUX, or an electrostatic discharge circuit portion ESD.

A panel crack detector (or a crack detection line) PCD may be further disposed on a portion of the non-active area NA of the substrate 110.

The panel crack detector PCD may be disposed between an end point (or end) of the substrate 110 and the dam DAM. Alternatively, the panel crack detector PCD may be disposed under the dam DAM and at least partially overlap the dam DAM.

Referring to FIG. 2, the light emitting display apparatus having a 3T1C structure including three thin film transistors and one storage capacitor is described as an example, but the light emitting display apparatus of the present disclosure is not limited to this structure, and may be applied to various structures such as 4T1C, 5T1C, 6T1C, 7T1C, 8T1C, 4T2C, 5T2C, 6T2C, 7T2C, and 8T2C.

Referring to FIG. 2, the light emitting display apparatus 100 according to the embodiment of the present disclosure may include a gate line GL, a data line DL, a power line PL, and a sensing line SL. Each subpixel SP may include a first switching thin film transistor ST1, a second switching thin film transistor ST2, a driving thin film transistor DT, a light emitting element D, and a storage capacitor Cst.

The light emitting element D may include an anode connected to a second node N2, a cathode connected to an input terminal of a low potential driving voltage EVSS, and a light emitting element layer positioned between the anode and the cathode.

The driving thin film transistor DT may control a current Id flowing through the light emitting element D according to a gate-source voltage Vgs thereof. The driving thin film transistor DT may have a gate electrode connected to a first node N1, a drain electrode connected to the power line PL to receive a high potential driving voltage EVDD, and a source electrode connected to the second node N2.

The storage capacitor Cst may be connected between the first node N1 and the second node N2. The storage capacitor Cst may maintain a constant voltage for one frame.

When driving, in response to a gate signal SCAN, the first switching thin film transistor ST1 may apply the data voltage Vdata charged in the data line DL to the first node N1 to turn the driving thin film transistor DT. The first switching thin film transistor ST1 may include a gate electrode connected to the gate line GL to receive the gate signal SCAN, a drain electrode connected to the data line DL to receive the data voltage Vdata, and a source electrode connected to the first node N1.

In response to a sensing signal SEN, the second switching thin film transistor ST2 may switch a current between the second node N2 and a sensing voltage readout line SRL to store a source voltage of the second node N2 in a sensing capacitor Cx of the voltage readout line SRL. When a display panel is driven, in response to the sensing signal SEN, the second switching thin film transistor ST2 may switch the current between the second node N2 and the sensing voltage readout line SRL to reset the source voltage of the driving the driving thin film transistor DT to an initialization voltage. At this time, a gate electrode of the second switching thin film transistor ST2 may be connected to the sensing line SL, a drain electrode of the second switching thin film transistor ST2 may be connected to the second node N2, and the source electrode of the second switching thin film transistor ST2 may be connected to the sensing voltage readout line SRL.

Figure 3A:
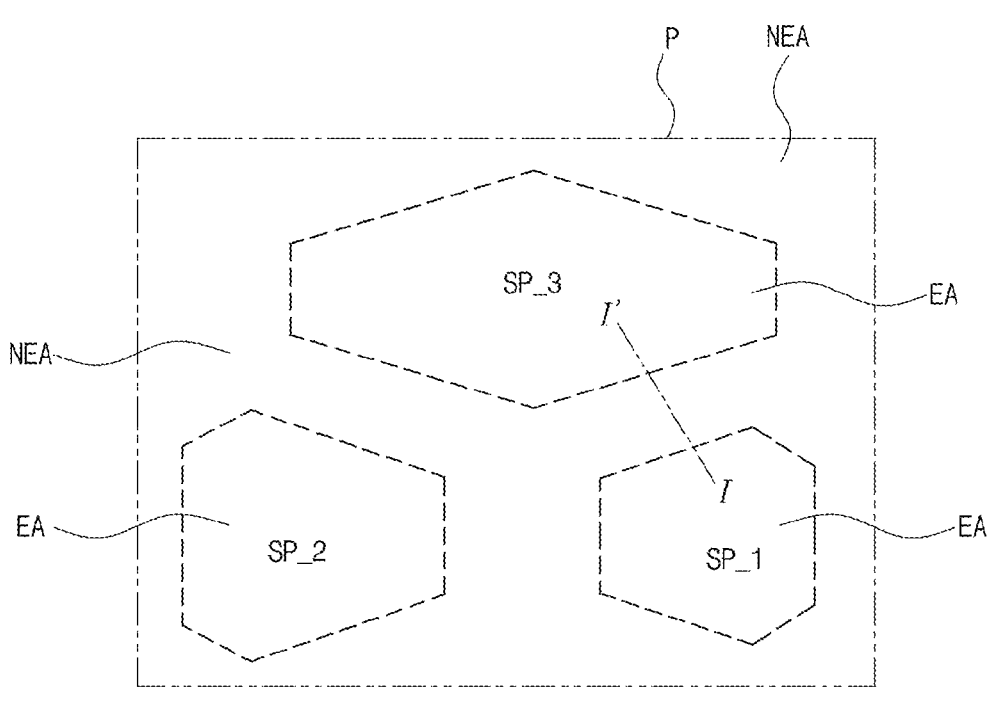
FIGS. 3A to 3C are views illustrating arrangements of subpixels of a light emitting display apparatus according to an embodiment of the present disclosure.
Figure 3B:
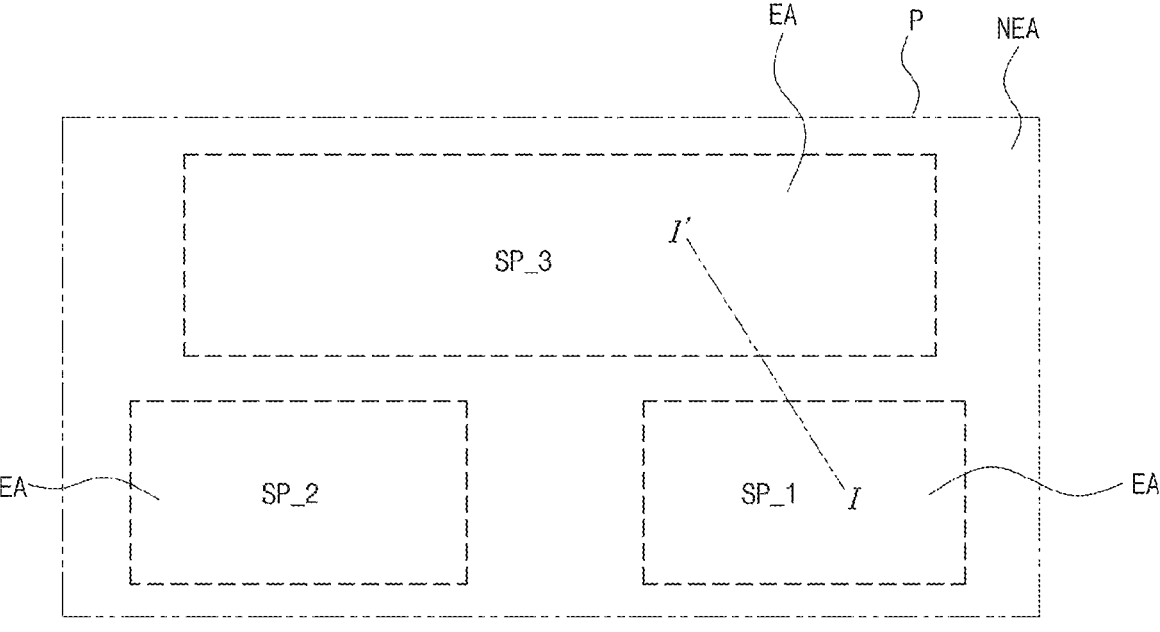
Figure 3C:
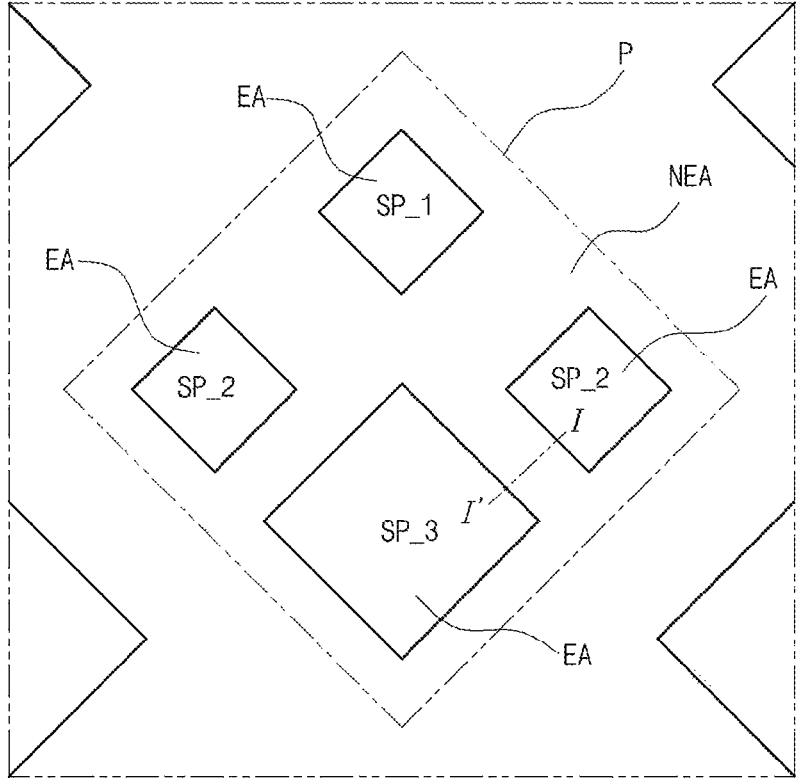

FIGS. 3A to 3C are views illustrating arrangements of subpixels of a light emitting display apparatus according to an embodiment of the present disclosure.

Referring to FIGS. 3A to 3C, the substrate 110 may include emitting portions EA and a non-emitting portion NEA disposed between the light emitting portions EA. A plurality of light emitting portions EA may be disposed on the substrate and spaced apart from each other. The non-emitting portion NEA may be disposed surrounding the light emitting portions EA.

Figure 4:
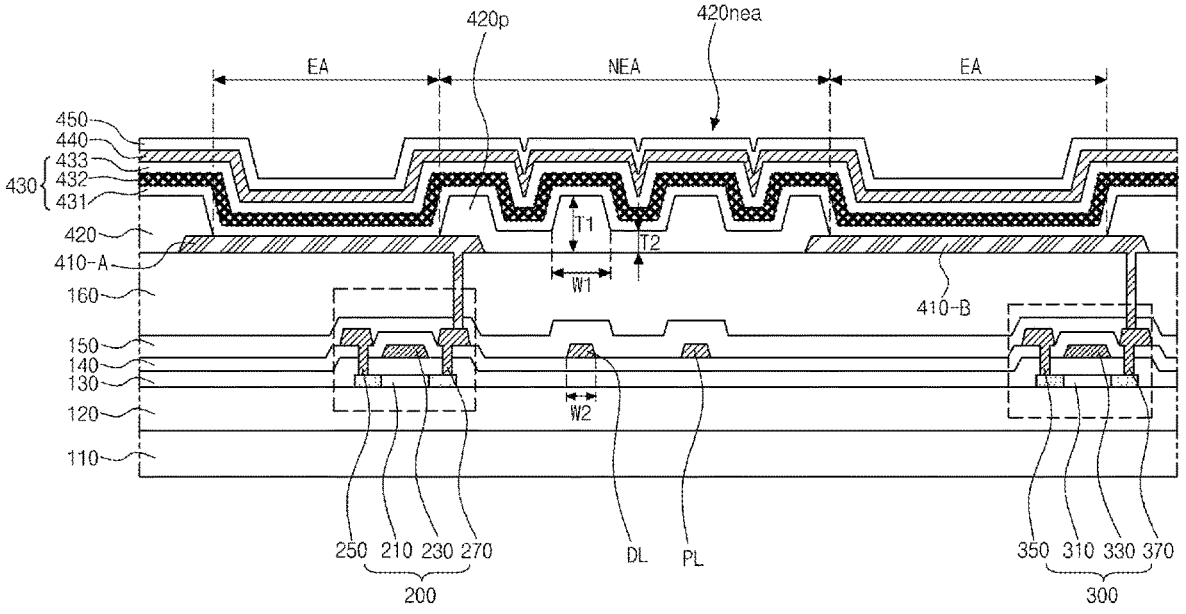
FIG. 4 is a cross-sectional view of a light emitting display apparatus according to an embodiment of the present disclosure.

The light emitting portion EA may be an area in a light emitting layer where light is emitted to the outside, and referring to FIG. 4, it may be an area where a bank 420 is not disposed.

The non-emitting portion NEA may be an area in the light emitting layer where light is not emitted to the outside, and referring to FIG. 4, it may be an area where the bank 420 is disposed.

The plurality of pixels P disposed in the emitting portion EA may include the first subpixel SP_1, the second subpixel SP_2, and the third subpixel SP_3.

Each of the first to third subpixels SP_1, SP_2 and SP_3 may include a light emitting portion EA.

In one pixel P, as shown in FIGS. 3A to 3C, subpixels SP emitting different colors may be disposed one by one. For example, the pixel P may include the first subpixel SP_1, the second subpixel SP_2, and the third subpixel SP_3.

An example shape of the first subpixel SP_1, the second subpixel SP_2, and the third subpixel SP_3 may be a quadrangle, pentagon, hexagon, octagon, circle, or ellipse, but is not limited thereto.

In one pixel P, at least one of the subpixels SP emitting different colors may be disposed in plurality, as shown in FIG. 3C. For example, a plurality of subpixels SP_2 emitting the same color may be formed in the pixel P.

The first subpixel SP_1 to the third subpixel SP_3 may emit light of different colors. Although the present disclosure is described on the assumption that the first subpixel SP_1 emits red light, the second subpixel SP_2 emits green light, and the third subpixel SP_3 emits blue light, the colors emitted from the light emitting layers are not limited thereto.

The third subpixel SP_3 may have a larger area than other subpixels. A distance between the third subpixel SP_3 and another adjacent subpixel may be smaller than a distance between the first subpixel SP_1 and the second subpixel SP_2.

Referring to FIGS. 3A to 3C, a third subpixel SP_3 may be disposed over other subpixels with respect to a direction in plane.

As the first subpixel SP_1 to the third subpixel SP_3 implement a high resolution of the light emitting display apparatus 100, a separation distance between the subpixels decreases.

The light emitting display apparatus 100 may include a light emitting element layer including a plurality of light emitting units. The light emitting display apparatus 100 may further include a charge generation layer between the plurality of light emitting units. The charge generation layer may adjust a charge balance between the plurality of light emitting units.

The charge generation layer may include a plurality of layers including a first charge generation layer and a second charge generation layer. The first charge generation layer may include an N-type charge generation layer and a P-type charge generation layer. The first charge generation layer may be formed of an organic layer doped with an alkali metal such as lithium (Li), sodium (Na), potassium (K), or cesium (Cs), or an alkaline earth metal such as magnesium (Mg), strontium (Sr), barium (Ba), or radium (Ra). At this time, the metal included in the first charge generating layer causes a lateral leakage current (LLC).

For example, when a specific subpixel is operated, due to a current leaked between adjacent pixels in a lateral direction, an adjacent subpixel emits light weakly, which results in distortion of image information.

A driving voltage required for the third subpixel SP_3 to emit blue light may be higher than a driving voltage required for other red or green light to be emitted.

When driving the third subpixel SP_3, neighboring subpixels are weakly driven. In this regard, electrons of the third subpixel SP_3 to move to the adjacent subpixel through the first charge generation layer continuously disposed between the adjacent pixels, and thus the weakly driving is made. Accordingly, neighboring subpixels in a non-driving state enter a state similar to a driving state and emit weak light. In this case, the color purity is lowered, causing a problem in that the color reproduction rate is lowered. In many cases, this phenomenon is recognized in low gray levels.

Figure 5:
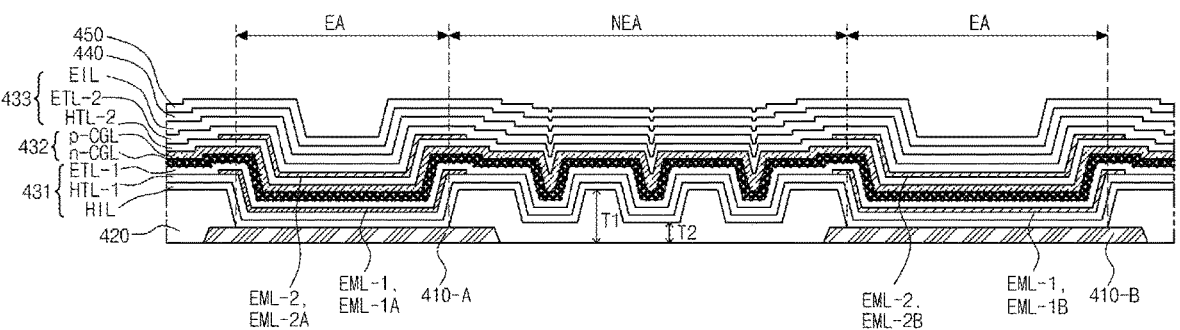
FIG. 5 is an enlarged cross-sectional view of a light emitting element layer of FIG. 4.

FIG. 4 is a cross-sectional view of a light emitting display apparatus according to an embodiment of the present disclosure. FIG. 4 is a cross-sectional view taken along a line I-I' of FIGS. 3A to 3C. FIG. 5 is an enlarged cross-sectional view of a light emitting element layer of FIG. 4.

Referring to FIG. 4, the light emitting display apparatus 100 according to an embodiment of the present disclosure may include a substrate 110, a bank 420, a first light emitting unit 431, a charge generation layer 432, and a second light emitting unit 433.

The substrate 110 may support various components of the light emitting display apparatus 100. The substrate 110 may be made of glass, or plastic material having flexibility.

For example, the substrate 110 may be formed of at least one of, but not limited to, polyimide (PI), polymethylmeth-acrylate (PMMA), polyethylene terephthalate (PET), polyethersulfone, and polycarbonate.

When the substrate 110 is made of a plastic material, for example, when the substrate 110 is made of polyimide, a process of manufacturing the light emitting display apparatus 100 may be performed in a situation where a support substrate made of glass is disposed under the substrate 110, and after the manufacturing process of the light emitting display apparatus is completed, the support substrate may be released or laser trimmed. Also, after the support substrate is released, a back plate for supporting the substrate 110 may be disposed under the substrate 110.

When the substrate 110 is made of polyimide, moisture penetrates the substrate 110 made of polyimide and proceeds to the thin film transistor or light emitting element layer, thereby degrading performance of the light emitting display apparatus 100. The light emitting display apparatus 100 according to an embodiment of the present disclosure may be configured to include two pieces of polyimide to prevent deterioration in performance of the display apparatus due to moisture permeation. In addition, by forming an inorganic film between the two pieces of polyimide, it is possible to block penetration of moisture into the lower polyimide, thereby improving product performance reliability. The inorganic layer may be formed of a single layer of silicon nitride (SiNx) or silicon oxide (SiOx) or multiple layers thereof, but is not limited thereto.

The substrate 110 may also be referred to as a component including elements and functional layers formed on the substrate 110, for example, a switching thin film transistor, a driving thin film transistor connected to the switching thin film transistor, an organic light emitting element connected to the driving thin film transistor, a passivation layer, and the like, but is not limited thereto.

The buffer layer 120 may be disposed on the entire surface of the substrate 110. The buffer layer 120 may serve to improve adhesion between layers formed on the buffer layer and the substrate 110, and to block various types of defects such as alkali components flowing out from the substrate 110. In addition, the buffer layer 120 may delay diffusion of moisture or oxygen penetrating into the substrate 110.

The buffer layer 120 may be formed of a single layer or multiple layers of silicon nitride (SiNx) or silicon oxide (SiOx). When the buffer layer 120 is formed of multiple layers, silicon oxide (SiOx) and silicon nitride (SiNx) may be alternately formed.

The buffer layer 120 may be omitted based on type and material of the substrate 110, structure and type of the thin film transistor, and the like.

A first thin film transistor 200 and a second thin film transistor 300 may be disposed on the buffer layer 120. The first thin film transistor 200 and the second thin film transistor 300 may each include a semiconductor pattern, a gate electrode, a source electrode, and a drain electrode.

For convenience of explanations, only a driving thin film transistor among various thin film transistors that may be included in the light emitting display apparatus 100 is illustrated, but other thin film transistor(s) such as a switching thin film transistor may also be included in the light emitting display apparatus 100. Also, for convenience of explanations, the thin film transistor is described as having a top gate structure, but is not limited to this structure, and may be implemented in other structure such as a bottom gate structure.

A first semiconductor pattern 210 of the first thin film transistor 200 and a second semiconductor pattern 310 of the second thin film transistor 300 may be disposed on the buffer layer 120.

The first semiconductor pattern 210 and the second semiconductor pattern 310 may be formed of a polycrystalline semiconductor. For example, the polycrystalline semiconductor may be made of low temperature poly silicon (LTPS) having high mobility, but is not limited thereto. When the semiconductor patterns 210 and 310 are made of a polycrystalline semiconductor, energy consumption power is low and reliability is excellent.

In some implementations, the first semiconductor pattern 210 and the second semiconductor pattern 310 may be formed of an oxide semiconductor. For example, it may be made of one of, but not limited to, indium-gallium-zinc-oxide (IGZO), indium-zinc-oxide (IZO), indium-gallium-tin-oxide (IGTO), and indium-gallium-oxide (IGO). When the first semiconductor pattern 210 and the second semiconductor pattern 310 are formed of an oxide semiconductor, an effect of blocking leakage current is excellent, and therefore, a change in luminance of a subpixel can be minimized during low-speed driving.

When the first semiconductor pattern 210 and the second semiconductor pattern 310 are formed of a polycrystalline semiconductor or oxide semiconductor, a portion of each of the first semiconductor pattern 210 and the second semiconductor pattern 310 may be doped with impurities.

In some implementations, the first semiconductor pattern 210 and the second semiconductor pattern 310 may be made of amorphous silicon (a-Si) or various organic semiconductor materials such as pentacene, but are not limited thereto.

A first insulating layer 130 may be disposed on the first semiconductor pattern 210 and the second semiconductor pattern 310.

The first insulating layer 130 may be disposed between the first and second semiconductor patterns 210 and 310, and a first gate electrode 230 and a second gate electrode 330.

The first insulating layer 130 may insulate the first semiconductor pattern 210 and the first gate electrode 230. The first insulating layer 130 may insulate the second semiconductor pattern 310 and the second gate electrode 330.

The first insulating layer 130 may be formed of an inorganic insulating material such as silicon nitride (SiNx) or silicon oxide (SiOx), or may be formed of an organic insulating material, but is not limited thereto.

The first insulating layer 130 may have a hole to electrically connect each of the first source electrode 250 and the first drain electrode 270 to the first semiconductor pattern 210. Also, the first insulating layer 130 may have a hole to electrically connect each of the second source electrode 350 and the second drain electrode 370 to the second semiconductor pattern 310.

The first gate electrode 230 of the first thin film transistor 200 and the second gate electrode 330 of the second thin film transistor 300 may be disposed on the first insulating layer 130.

The first gate electrode 230 may be disposed to overlap the first semiconductor pattern 210, and the second gate electrode 330 may be disposed to overlap the second semiconductor pattern 310.

The first gate electrode 230 and the second gate electrode 330 may be formed of a single layer made of one of molybdenum (Mo), copper (Cu), titanium (Ti), aluminum (Al), chromium (Cr), gold (Au), or nickel (Ni), neodymium (Nd), tungsten (W), gold (Au), transparent conductive oxide (TCO) and an alloy thereof, or multiple layers made of at least two of the above materials, but not limited thereto.

A second insulating layer 140 may be disposed on the first gate electrode 230 and the second gate electrode 330.

The second insulating layer 140 may be disposed between the first gate electrode 230 and the second gate electrode 330, and the first source electrode 250, the first drain electrode 270, the second source electrode 350 and the second drain electrode 370.

The second insulating layer 140 may insulate the first gate electrode 230 from the first source electrode 250 and the second drain electrode 270. Also, the second insulating layer 140 may insulate the second gate electrode 330 from the second source electrode 350 and the second drain electrode 370.

The second insulating layer 140 may be formed of an inorganic insulating material such as silicon nitride (SiNx) or silicon oxide (SiOx), and may be formed of an organic insulating material, but is not limited thereto.

The second insulating layer 140 may have a hole to electrically connect each of the first source electrode 250 and the first drain electrode 270 to the first semiconductor pattern 210. Also, the second insulating layer 140 may have a hole to electrically connect each of the second source electrode 350 and the second drain electrode 370 to the second semiconductor pattern 310.

The first source electrode 250 and the first drain electrode 270 of the first thin film transistor 200 may be disposed on the second insulating layer 140. The second source electrode 350 and the second drain electrode 370 of the second thin film transistor 300 may be disposed on the second insulating layer 140.

The first source electrode 250 and the first drain electrode 270 may be electrically connected to the first semiconductor pattern 210 through respective holes in the first insulating layer 130 and the second insulating layer 140.

The second source electrode 350 and the second drain electrode 370 may be electrically connected to the second semiconductor pattern 310 through respective holes in the first insulating layer 130 and the second insulating layer 140.

The first source electrode 250, the first drain electrode 270, the second source electrode 350, and the second drain electrode 370 may be formed a signal layer made of one of molybdenum (Mo), copper (Cu), titanium (Ti), aluminum (Al) any one of chromium (Cr), gold (Au), nickel (Ni), neodymium (Nd), tungsten (W), gold (Au), transparent conductive oxide (TCO) or an alloy thereof, or may be made of multiple layers made of at least two of the above materials, but is not limited thereto.

For example, the first source electrode 250, the first drain electrode 270, the second source electrode 350, and the second drain electrode 370 are formed of triple layers of titanium (Ti)/aluminum (Al)/titanium (Ti), but is not limited thereto.

A data line DL and/or a power line PL may be further disposed in the non-emitting area NEA on the second insulating layer 140. In this case, the data line DL and/or the power line PL may be formed of the same material, structure, or manufacturing method as the first source electrode 250, the first drain electrode 270, the second source electrode 350, and the second drain electrode 370.

The data line DL and/or the power line PL may be disposed between neighboring subpixels. The power line PL may be disposed parallel to the data line DL. The power line PL may be formed together when a connection electrode described later is disposed.

The power line PL may be a line branched from a high potential voltage line VDD disposed in the non-emitting portion NEA and disposed in the emitting portion EA, and may be provided with a high potential driving voltage EVDD.

The power line PL may extend parallel to or cross one of the gate line and the data line DL. Alternatively, the power wiring PL may be configured in a mesh pattern formed by crossing metal lines having a small line width. A shape of the mesh pattern may be a quadrangle, pentagon, hexagon, circle, ellipse, etc., but is not limited thereto.

A passivation layer 150 may be disposed on the first source electrode 250, the first drain electrode 270, the second source electrode 350, and the second drain electrode 370.

The passivation layer 150 may protect the first thin film transistor 200 and the second thin film transistor 300. The passivation layer 150 may be formed of an inorganic insulating material such as silicon nitride (SiNx) or silicon oxide (SiOx), or may be formed of an organic insulating material, but is not limited thereto.

The passivation layer 150 may have a hole to electrically connect a first anode 410_A to the first thin film transistor 200. Also, the passivation layer 150 may have a hole to electrically connect a second anode 410_B to the second thin film transistor 300. The passivation layer 150 may be omitted according to a design of the light emitting display apparatus 100.

A planarization layer 160 may be disposed on the passivation layer 150. Alternatively, the planarization layer 160 may be disposed on the first thin film transistor 200 and the second thin film transistor 300.

The planarization layer 160 may protect the thin film transistors disposed below the planarization layer 160, and may alleviate or planarize steps caused by various patterns.

The planarization layer 160 may be formed of at least one of organic insulating materials, for example, but not limited to, benzocyclobutene (BCB), acrylic resin, epoxy resin, phenolic resin, polyamide resin and polyimide resin.

The planarization layer 160 may be configured with a single layer, or may be configured with two or more layers in consideration of arrangement of electrodes.

As the light emitting display apparatus 100 evolves to a higher resolution, various signal lines increase, so it is difficult to arrange all the lines on one layer while ensuring a minimum interval, so additional layer(s) may be formed. This additional layer frees up wiring layout, making wire/electrode layout design easier. In addition, when a dielectric material is used for a planarization layer configured with multiple layers, the planarization layer 160 may be used for forming capacitance between metal layers.

When the planarization layer 160 is formed as two layers, it may include a lower planarization layer and an upper planarization layer.

For example, a hole may be formed in the upper planarization layer and a connection electrode may be disposed in the hole, so that the thin film transistor and the light emitting element layer may be electrically connected through the connection electrode.

One end (or a part) of the connection electrode may be connected to the thin film transistor, and the other end (or another part) of the connection electrode may be connected to the light emitting element layer.

The first anode 410-A and the second anode 410-B may be disposed on the planarization layer 160.

The first anode 410-A may be electrically connected to the first drain electrode 270 through a hole in the planarization layer 160. The second anode 410-B may be electrically connected to the second drain electrode 370 through a hole in the planarization layer 160. Alternatively, when the light emitting display apparatus 100 further includes a connection electrode, each of the first anode 410-A and the second anode 410-B may be electrically connected to the corresponding drain electrode through the connection electrode.

When the light emitting display apparatus 100 is a top emission type, the first anode 410-A and the second anode 410-B may be formed as reflective electrodes, which reflect light, using an opaque conductive material. The first anode 410-A and the second anode 410-B may be made of at least one of silver (Ag), aluminum (Al), gold (Au), molybdenum (Mo), tungsten (W), chromium (Cr) and an alloy thereof. For example, each of the first anode 410-A and the second anode 410-B may have a triple-layered structure of silver (Ag)/lead (Pd)/copper (Cu), but is not limited thereto. In addition, the first anode 410-A and the second anode 410-B may further include a transparent conductive material layer having a high work function, such as indium-tin-oxide (ITO).

When the light emitting display apparatus 100 is a bottom emission type, the first anode 410-A and the second anode 410-B may be formed using a transparent conductive material that transmits light. For example, the first anode 410-A and the second anode 410-B are made of at least one of indium tin oxide (ITO) and indium zinc oxide (IZO).

A bank 420 may be disposed on the first anode 410-A, the second anode 410-B, and the planarization layer 160.

The bank 420 may separate (or divide) a plurality of subpixels SP, minimize a light blurring phenomenon, and prevent color mixing occurring at various viewing angles.

The bank 420 may separate the emitting portion EA and the non-emitting portion NEA, and the bank 420 may be disposed in the non-emitting portion NEA.

The bank 420 may have a bank hole (or opening) exposing the first anode 410-A and the second anode 410-B.

The bank 420 may be formed of at least one of an inorganic insulating material such as silicon nitride (SiNx) or silicon oxide (SiOx), an organic insulating material such as benzocyclobutene (BCB), acrylic resin, epoxy resin, phenolic resin, polyamide resin or polyimide resin, and a photosensitizer including a black pigment, but is not limited thereto.

The bank 420 may be transparent, black or colored.

The bank 420 may be disposed to cover the ends of the first anode 410-A and the second anode 410-B.

The bank 420 may have at least two thicknesses. Due to the at least two thicknesses, the top surface of the bank 420 may be uneven.

The bank 420 may have at least one protrusion 420p. The protrusions of the bank 420 may be formed by removing portions of the bank 420. The protrusion of the bank 420 may have a first thickness T1. A region except for the region where the protrusion is formed may have a second thickness T2 different in value from the first thickness T1. That is, in a portion 420nea of the bank 420 between two adjacent subpixels, the bank 420 has an uneven surface and different heights.

The first thickness T1 of the bank 420 may be greater than the second thickness T2. The second thickness T2 of the bank 420 may have a thickness of ½ to ⅓ of the first thickness T1 of the bank 420.

The protrusion 420p of the bank 420 may be formed at a region overlapping the data line DL or the power line PL. A width W1 of the protrusion may be greater than a width W2 of the data line DL or the power line PL. Accordingly, there is an effect of preventing the data line DL or the power line PL from being reflected by an external light and being recognized by a user.

The second thickness T2 of the bank 420 may be formed by removing a portion of the bank 420. As shown, the unevenness or uneven portions of the bank 420 may be formed in a shape obliquely cut from a top surface, but not limited thereto, it may be formed in various shapes.

Due to the protrusions or unevenness/uneven portions formed in the bank 420, a length of the light emitting element layer disposed on the bank may increase. For example, the light emitting element layer is disposed along the protrusions formed in the bank 420 and the dents where the protrusions are not formed, which increases a distance at which electrons move to neighboring subpixels in the light emitting element layer, and therefore, when driving, the electrons formed inside the light emitting element layer may be prevented from moving to the neighboring subpixels. That is, an electron transfer path between two neighboring subpixels is formed following the uneven portion of the upper surface of the bank 420, e.g., along the protrusions and the dents. As a result, a a distance of the electron transfer path for an electron to move from one subpixel to another of two neighboring subpixels is greater than the distance between the two neighboring subpixels.

The light emitting element layer 430 may be disposed on the bank 420 and the first anode 410-A and the second anode 410-B.

The light emitting element layer 430 may include a first light emitting unit 431, a charge generating layer 432, and a second light emitting unit 433.

The light emitting element layer 430 may be disposed along the unevenness formed at the top surface of the bank 420.

For convenience of explanations, only two light emitting units are shown, but three or more light emitting units and two or more charge generation layers between the three or more light emitting units may be further included.

Hereinafter, the light emitting element layer of the present disclosure is described in detail with further reference to FIG. 5. FIG. 5 is an enlarged cross-sectional view of the light emitting element layer of FIG. 4.

Referring to FIG. 5, the first light emitting unit 431 may be disposed on the bank 420 and the first anode 410-A and the second anode 410-B.

The first light emitting unit 431 may include a hole injection layer HIL, a first hole transport layer HTL-1, a first light emitting layer EML-1, and a first electron transport layer ETL-1.

The first light emitting layer EML-1 may include a plurality of sub light emitting layers, such as a first sub light emitting layer EML-1A and a second sub light emitting layer EML-1B as shown in FIG. 5.

The hole injection layer HIL, the first hole transport layer HTL-1, and the first electron transport layer ETL-1 may be disposed to correspond to all the subpixels. For example, they may be continuously disposed on each subpixel and between neighboring subpixels without interruption. In some implementations, they may be discontinuously disposed on each subpixel with at least part disconnected between neighboring subpixels.

The hole injection layer HIL may be disposed on the bank 420, the first anode 410-A and the second anode 410-B. The hole injection layer HIL may be disposed along the unevenness formed at the top surface of the bank 420.

The hole injection layer HIL may serve to facilitate a hole injection, and may be formed of at least one selected from a group consisting of HATCN (1,4,5,8,9,11-hexaazatriphenylene-hexanitrile) and CuPc (copper phthalocyanine), PEDOT (poly(3,4)-ethylenedioxythiophene), PANI (polyaniline), and NPD (N, N-dinaphthyl-N, N'-diphenylbenzidine), but is not limited thereto.

The first hole transport layer HTL-1 may be disposed on the hole injection layer HIL. The first hole transport layer HTL-1 may be disposed along the unevenness formed at the top surface of the bank 420.

The first hole transport layer HTL-1 may serve to facilitate a hole transport, and may be formed of at least one selected from a group consisting of NPD (N,N-dinaphthyl-N,N'-diphenylbenzidine), TPD (N,N'-bis-(3-methylphenyl))-N,N'-bis-(phenyl)-benzidine), s-TAD and MTDATA (4,4',4''-Tris(N-3-methylphenyl-N-phenyl-amino)-triphenylamine), but is not limited thereto.

The first sub light emitting layer EML-1A and the second sub light emitting layer EML-1B may be disposed on the first hole transport layer HTL-1.

The first sub light emitting layer EML-1A and the second sub light emitting layer EML-1B may overlap the bank 420 at least partially, and may be formed to be separated at a region between neighboring subpixels. For example, the first sub light emitting layer EML-1A and the second sub-emitting layer EML-1B may be deposited on each subpixel using a fine metal mask (FMM).

The first sub light emitting layer EML-1A may overlap a third sub light emitting layer EML-2A included in a second light emitting layer EML-2 in the second light emitting unit 433. The first sub light emitting layer EML-1A may emit light of the same color as the third sub light emitting layer EML-2A included in the second light emitting unit 433. The first sub light emitting layer EML-1A may emit light of the same wavelength as the third sub light emitting layer EML-2A included in the second light emitting unit 433.

The second sub light emitting layer EML-1B may overlap a fourth sub light emitting layer EML-2B included in the second light emitting layer EML-2 in the second light emitting unit 433. The second sub light emitting layer EML-1B may emit light of the same color as the fourth sub light emitting layer EML-2B included in the second light emitting unit 433. The second sub light emitting layer EML-1B may emit light of the same wavelength as the fourth sub light emitting layer EML-2B included in the second light emitting unit 433.

The first sub light emitting layer EML-1A and the second sub light emitting layer EML-1B may include respective light emitting materials which emit different colors and emit difference ones of red, green and blue light, and the light emitting material of each of the first sub light emitting layer EML-1A and the second sub light emitting layer EML-1B may be formed using a phosphorescent material or a fluorescent material.

For example, the first sub emitting layer EML-1A may emit red or green light, and the second sub emitting layer EML_1B may emit blue light.

For example, when the first sub light emitting layer EML-1A emits red light, the first sub light emitting layer EML-1A may be formed of a phosphorescent material which includes a host material containing CBP (carbazole biphenyl) or mCP (1,3-bis(carbazol-9-yl), and a dopant containing one or more selected from a group consisting of PIQIr(acac) (bis(1-phenylisoquinoline) acetylacetonate iridium), PQIr (acac)(bis(1-phenylquinoline) acetylacetonate iridium), PQIr(tris(1-phenylquinoline) iridium) and PtOEP(octaethylporphyrin platinum), or a fluorescent material containing PBD:Eu(DBM)3(Phen) or Perylene, but not limited thereto.

When the first sub emitting layer EML-1A emits green light, the first sub-emitting layer EML-1A may be formed of a phosphorescent material which includes a host material containing CBP or mCP, and a dopant material such as Ir complex including Ir(ppy)3(fac tris(2-phenylpyridine)

iridium), or a fluorescent material including Alq3 (tris(8-hydroxyquinolino)aluminum), but is not limited thereto.

When the second sub light emitting layer EML-1B emits blue light, the second sub light emitting layer EML-1B may be formed of a phosphorescent material which includes a host material containing CBP or mCP, and a dopant material containing (4,6-F2ppy)2Irpic. Alternatively, the second sub light emitting layer EML-1B may be formed of a fluorescent material including one selected from a group consisting of spiro-DPVBi, spiro-6P, distylbenzene (DSB), distryl arylene (DSA), PFO-based polymer and PPV-based polymer, but is not limited thereto.

The first sub light emitting layer EML-1A and the second sub light emitting layer EML-1B may further include an auxiliary light emitting layer. For example, the auxiliary light emitting layer may be disposed below or on the first sub light emitting layer EML-1A. The auxiliary light emitting layer may emit light of the same color as or a different color from that of the first sub light emitting layer EML-1A. Alternatively or additionally, the auxiliary light emitting layer may be disposed below or on the second sub light emitting layer EML-1B. The auxiliary light emitting layer may emit light of the same color or a different color from that of the second sub light emitting layer EML-1B.

A first electron transport layer ETL-1 may be disposed on the first sub light emitting layer EML-1A, the second sub light emitting layer EML-1B, and the first hole transport layer HTL-1.

The first electron transport layer ETL-1 may serve to facilitate the transport of electrons, and may be formed of one or more selected from the group consisting of Alq3(tris (8-hydroxyquinolino)aluminum), PBD(2-(4-biphenylyl)-5-(4-tert-butylpheny)-1,3,4oxadiazole), TAZ, spiro-PBD, BAlq, and SAlq, but is not limited thereto.

An electron injection layer EIL may be further disposed on the first electron transport layer ETL-1.

A charge generation layer 432 may be disposed on the first light emitting unit 431. The charge generation layer 432 may be disposed on the first electron transport layer ETL-1 of the first light emitting unit 431. The charge generating layer 432 may be disposed along the protrusions or unevenness formed at the top surface of the bank 420.

The charge generation layer 432 may include an n-type charge generation layer n-CGL that helps inject electrons into the first light emitting unit 431 and a p-type charge generation layer that p-CGL helps injecting holes into the second light emitting unit 433.

The n-type charge generation layer n-CGL may be formed of an alkali metal, an alkali metal compound, or an organic material or compound thereof serving as electron injection. For example, the n-type charge generation layer n-CGL may be formed of a mixed layer of an n-type material such as an anthracene derivative doped with lithium (Li) or cesium (Cs), but is not limited thereto.

The p-type charge generating layer p-CGL may be formed of an organic material used as a material for a hole injection layer. For example, the p-type charge generating layer p-CGL may be formed of a single layer of a p-type material such as HATCN or F4-TCNQ, but is not limited thereto.

The n-type charge generating layer n-CGL and the p-type charge generating layer p-CGL may be disposed along the unevenness formed at the top surface of the bank 420.

In the light emitting display apparatus 100 according to an embodiment of the present disclosure, since the light emitting element layer is disposed along the protrusions or unevenness formed at the top portion of the bank, the distance that electrons move to neighboring subpixels is increased, thereby blocking the lateral leakage current. That is, it is possible to prevent electrons formed inside the light emitting element layer from moving to neighboring pixels during driving.

In addition, the lateral leakage current can be blocked even if the distance between neighboring subpixels is reduced. In particular, it is possible to solve a visibility defect in which neighboring subpixels emit light at low gray levels and improve color reproduction rate.

The second light emitting unit 433 may be disposed on the charge generation layer 432.

The second light emitting unit 433 may include a second hole transport layer HTL-2, a second light emitting layer, a second electron transport layer ETL-2, and a second electron injection layer EIL.

The second hole transport layer HTL-2 may be disposed on the charge generation layer 432. The second hole transport layer HTL-2 may be disposed on the p-type charge generation layer p-CGL.

The second hole transport layer HTL-2 may be disposed along the unevenness formed at the top surface of the bank 420.

The hole injection layer HIL may be further disposed between the p-type charge generating layer p-CGL and the second hole transport layer HTL-2.

The second hole transport layer HTL-2 may serve to facilitate the transport of holes, and may be formed of one or more selected from a group consisting of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but is not limited thereto.

The third sub light emitting layer EML-2A and the fourth sub light emitting layer EML-2B may be disposed on the second hole transport layer HTL-2.

The third sub light emitting layer EML-2A and the fourth sub light emitting layer EML-2B may at least partially overlap the bank 420, and may be separated at a region between neighboring subpixels. For example, the third sub light emitting layer EML-2A and the fourth sub light emitting layer EML-2B may be deposited on each subpixel using a fine metal mask (FMM).

The third sub light emitting layer EML-2A may overlap the first sub light emitting layer EML-1A included in the first light emitting unit 431. The third sub light emitting layer EML-2A may emit light of the same color as the first sub light emitting layer EML-1A included in the first light-emitting unit 431. The third sub light emitting layer EML-2A may emit light of the same wavelength as the first sub light emitting layer EML-1A included in the first light emitting unit 431.

The fourth sub light emitting layer EML-2B may overlap the second sub light emitting layer EML-1B included in the first light emitting unit 431. The fourth sub light emitting layer EML-2B may emit light of the same color as the second sub light emitting layer EML-1B included in the first light emitting unit 431. The fourth sub light emitting layer EML-2B may emit light of the same wavelength as the second sub light emitting layer EML-1B included in the first light emitting unit 431.

The third sub light emitting layer EML-2A and the fourth sub light emitting layer EML-2B may include respective light emitting materials emitting different colors and emit different ones of red, green and blue light, and the light emitting material of the third sub light emitting layer EML- 2A and the fourth sub light emitting layer EML-2B may be formed using a phosphorescent material of a fluorescent material.

For example, the third sub light emitting layer EML-2A may emit red or green light, and the fourth sub light emitting layer EML-2B may emit blue light.

In some implementations, when the third sub light emitting layer EML-2A emits red light, the third sub light emitting layer EML-2A may be formed of a phosphorescent material which includes a host material containing CBP (carbazole biphenyl) or mCP (1,3-bis(carbazol-9-yl), and a dopant containing one or more selected from a group consisting of PIQIr(acac)(bis(1-phenylisoquinoline) acetylacetonate iridium), PQIr (acac)(bis(1-phenylquinoline) acetylacetonate iridium), PQIr (tris(1-phenylquinoline) iridium) and PtOEP (octaethylporphyrin platinum), or a fluorescent material containing PBD:Eu(DBM)3(Phen) or Perylene, but not limited thereto.

When the third sub light emitting layer EML-2A emits green light, the third sub light emitting layer EML-2A may be formed of a phosphorescent material which includes a host material containing CBP or mCP, and a dopant material such as Ir complex including Ir(ppy)3(fac tris(2-phenylpyridine)iridium), or a fluorescent material including Alq3 (tris (8-hydroxyquinolino)aluminum), but is not limited thereto.

When the fourth sub light emitting layer EML-2B emits blue light, the fourth sub light emitting layer EML-2B may be formed of a phosphorescent material which includes a host material containing CBP or mCP, and a dopant material including (4,6-F2ppy)2Irpic. Alternatively, the fourth sub light emitting layer EML-2B may be formed of a fluorescent material including one selected from a group consisting of spiro-DPVBi, spiro-6P, distylbenzene (DSB), distryl arylene (DSA), PFO-based polymer and PPV-based polymer, but is not limited thereto.

The third sub light emitting layer EML-2A and the fourth sub light emitting layer EML-2B may further include an auxiliary light emitting layer. For example, the auxiliary light emitting layer may be below or on the third sub light emitting layer EML-2A. The auxiliary light emitting layer may emit light of the same color as or a different color from that of the third sub light emitting layer EML-2A. Alternatively, the auxiliary light emitting layer may be disposed below or on the fourth sub light emitting layer EML-2B. The auxiliary light emitting layer may emit light of the same color as or a different color from that of the fourth sub light emitting layer EML-2B.

A second electron transport layer ETL-2 may be disposed on the third sub light emitting layer EML-2A, the fourth sub light emitting layer EML-2B, and the second hole transport layer HTL-2.

The second electron transport layer ETL-2 may serve to facilitate the transport of electrons, and may be formed of one or more selected from a group consisting of Alq3(tris (8-hydroxyquinolino)aluminum), PBD(2-(4-biphenylyl)-5-(4-tert-butylpheny)-1,3,4oxadiazole), TAZ, spiro-PBD, BAlq, and SAlq, but is not limited thereto.

An electron injection layer EIL may be disposed on the second electron transport layer ETL-2.

The electron injection layer EIL may serve to facilitate the injection of electrons, and may be formed of using Alq3(tris (8-hydroxyquinolino)aluminum), PBD(2-(4-biphenylyl)-5-(4-tert-butylpheny)-1,3,4oxadiazole), TAZ, spiro-PBD, BAlq or SAlq, but is not limited thereto.

Components included in the first light emitting unit 431 and the second light emitting unit 433 may be formed in a plurality of two or more or may be omitted, depending on circumstances.

A cathode 440 may be disposed on the second light emitting unit 433. The cathode 440 may be disposed on the electron injection layer EIL.

The cathode 440 may be disposed along the protrusions or unevenness formed at the top surface of the bank 420.

The cathode 440 may supply electrons to the light emitting element layer and may be made of a conductive material having a low work function.

When the light emitting display apparatus 100 is a top emission type, the cathode 440 may be formed using a transparent conductive material that transmits light. For example, the cathode 440 may be formed of at least one of indium tin oxide (ITO) and indium zinc oxide (IZO), but is not limited thereto.

In addition, the cathode 440 may be formed using a translucent conductive material that transmits light. For example, the cathode may be formed of at least one of alloys such as LiF/Al, CsF/Al, Mg:Ag, Ca/Ag, Ca:Ag, LiF/Mg:Ag, LiF/Ca/Ag, and LiF/Ca:Ag, but is not limited thereto.

When the light emitting display apparatus 100 is a bottom emission type, the cathode 440 may be formed as a reflective electrode, which reflects light, using an opaque conductive material. For example, the cathode 440 may be formed of at least one of silver (Ag), aluminum (Al), gold (Au), molybdenum (Mo), tungsten (W), chromium (Cr) and an alloy thereof.

A capping layer 450 may be disposed on the cathode 440.

The capping layer 450 may serve to increase a light extraction effect of the organic light emitting apparatus 100, and the capping layer 450 may be made of any material constituting the light emitting element layer 400. The capping layer 450 may be formed of two or more layers or may be omitted.

Hereinafter, an embodiment of the present disclosure is described with reference to FIG. 6.

Figure 6:
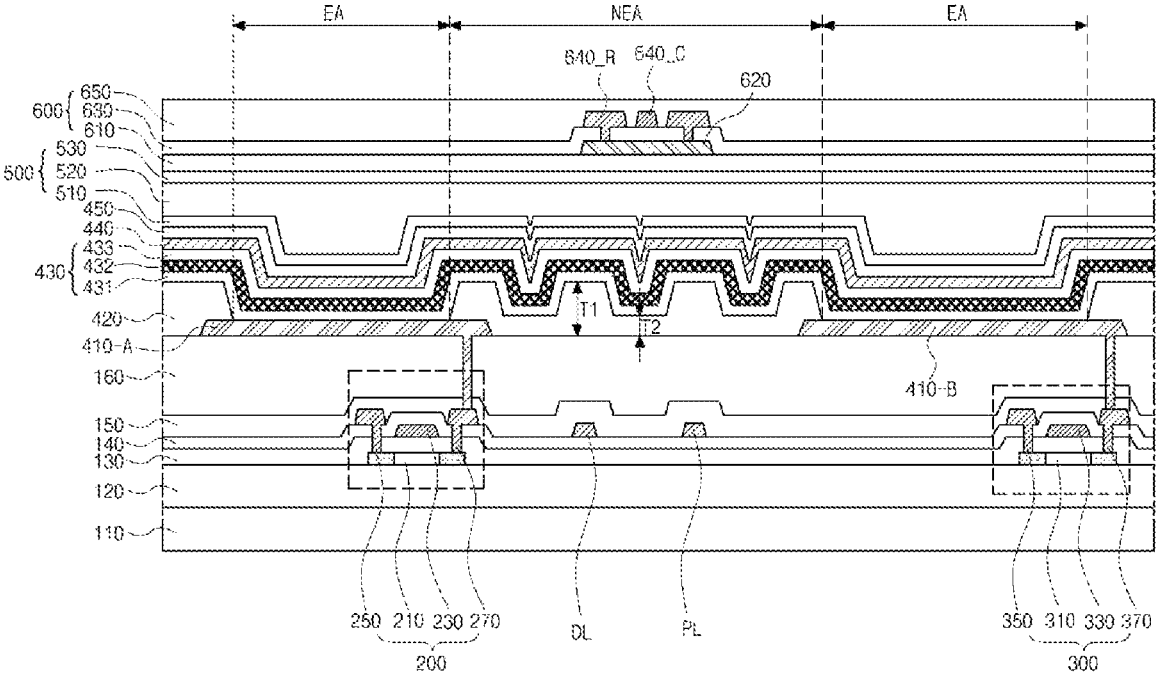
FIG. 6 is a cross-sectional view illustrating an encapsulation layer and a touch sensor layer disposed on a substrate according to an embodiment of the present disclosure.

The light emitting display apparatus 100 shown in FIG. 6 is substantially the same as the display apparatus of FIG. 4 except for an encapsulation layer 500 and a touch sensor layer 600, so that redundant explanations are omitted. For example, FIG. 6 does not show the first and second light emitting layers EML-1, EML-2 of FIG. 5, for simplicity.

FIG. 6 is a cross-sectional view illustrating an encapsulation layer and a touch sensor layer disposed on a substrate according to an embodiment of the present disclosure.

The encapsulation layer 500 may be disposed on the cathode 440 or the capping layer 450. The encapsulation layer 500 may protect the light emitting element layer 400 from external moisture, oxygen, or foreign substances. For example, penetration of oxygen and moisture from the outside may be prevented in order to prevent oxidation of the light emitting material and the electrode material.

The encapsulation layer 500 may be made of a transparent material so that light emitted from the light emitting layer is transmitted.

The encapsulation layer 500 may include a first encapsulation layer 510, a second encapsulation layer 520, and a third encapsulation layer 530 that block penetration of moisture or oxygen. The first encapsulation layer 510, the second encapsulation layer 520, and the third encapsulation layer 530 may have a structure in which they are alternately stacked.

The first encapsulation layer 510 and the third encapsulation layer 530 may be formed of at least one inorganic material selected from silicon nitride (SiNx), silicon oxide (SiOx), and aluminum oxide (AlyOz), but are not limited thereto. The first encapsulation layer 510 and the third encapsulation layer 530 may be formed using a vacuum deposition method such as chemical vapor deposition (CVD) or atomic layer deposition (ALD), but is not limited thereto.

Each of the first encapsulation layer 510 and the third encapsulation layer 530 may be formed of at least two or more layers. For example, the first encapsulation layer 510 may have a tripled-layered structure of silicon oxide (SiOx)/silicon nitride (SiNx)/silicon oxide (SiOx), but is not limited thereto. For example, the third encapsulation layer 530 may have a double-layered structure of silicon oxide (SiOx)/silicon nitride (SiNx), but is not limited thereto.

The second encapsulation layer 520 may cover foreign substances or particles that may occur in the manufacturing process. In addition, the second encapsulation layer 520 may planarize the surface of the first encapsulation layer 510. For example, the second encapsulation layer 520 may be a particle cover layer, but is not limited to the term.

The second encapsulation layer 520 may be an organic material, for example, a polymer such as silicon oxycarbon (SiOCz) epoxy, polyimide, polyethylene, or acrylate, but is not limited thereto.

The second encapsulation layer 520 may be made of a heat-curable or photo-curable material that is cured by heat or light.

The touch sensor layer 600 may be disposed on the encapsulation layer 500.

The touch sensor layer 600 may include a first touch electrode 640_R, a first touch connection electrode 620, a second touch electrode, and a second touch connection electrode 640_C.

A portion of the first touch electrode 640_R, the first touch connection electrode 620, the second touch electrode, and the second touch connection electrode 640_C may be disposed to overlap the bank 420, the power line, or the data line.

The first touch electrode 640_R, the second touch electrode, the first touch connection electrode 620, and the second connection electrode 620_C may be formed in a mesh pattern formed by crossing metal lines having small line widths. The mesh pattern may have a rhombus shape. Alternatively, the shape of the mesh pattern may be a quadrangle pentagon, hexagon, circle, ellipse, etc., but is not limited thereto.

The first touch electrode 640_R, the second touch electrode, the first touch connection electrode 620, and the second touch connection electrode 640_C may be formed using an opaque conductive material having low resistance. For example, the first touch electrode 640_R, the second touch electrode, the first touch connection electrode 620, and the second touch connection electrode 640_C may be formed of a single layer made of molybdenum (Mo), copper (Cu), titanium (Ti), aluminum (Al), chromium (Cr), gold (Au), nickel (Ni), neodymium (Nd), tungsten (W), transparent conductive oxide (TCO), or an alloy thereof, or multiple layers made of at least two of the above material, but is not limited thereto.

For example, the first touch electrode 640_R, the second touch electrode, the first touch connection electrode 620, and the second touch connection electrode 640_C are formed of a triple-layered structure of titanium (Ti)/aluminum (Al)/titanium (Ti), but is not limited thereto.

The first touch electrode 640_R, the second touch electrode, the first touch connection electrode 620, and the second touch connection electrode 640_C may be formed of the same material as the first source electrode 250, the first drain electrode 270, the second source electrode 350 and the second drain electrode 370.

A touch buffer layer 610 may be disposed on the encapsulation layer 500. The touch buffer layer 610 may block penetration of a chemical solution (e.g., developer, etchant, etc.) used in the manufacturing process of the touch sensor layer 600 or moisture from the outside into the light emitting element layer 400 containing an organic material. In addition, the touch buffer layer 610 may prevent a problem in which a plurality of touch sensor metals disposed on the touch buffer layer 610 are disconnected due to an external impact, and may block interference signals that may occur during driving of the touch sensor layer.

The touch buffer layer 610 may be formed as a single layer or multiple layers made of one or more of silicon oxide (SiOx) and silicon nitride (SiNx), but is not limited thereto. Alternatively, the touch buffer layer 610 may be formed of an organic material such as acrylic resin, epoxy resin, phenolic resin, polyamide resin, or polyimide resin.

The first touch connection electrode 620 may be disposed on the touch buffer layer 610.

For example, the first touch connection electrode 620 may be disposed between adjacent first touch electrodes 640_R in a first direction (or X-axis direction). The first touch connection electrode 620 may electrically connect a plurality of first touch electrodes 640_R disposed adjacently and spaced apart in the first direction (or the X-axis direction), but is not limited thereto.

The first touch connection electrode 620 may be disposed to overlap the second touch connection electrode 640_C which connects the second touch electrodes adjacent to each other in a second direction (or an Y-axis direction). Since the first touch connection electrode 620 and the second touch connection electrode 640_C are formed on different layers, they may be electrically insulated from each other.

A touch insulating layer 630 may be disposed on the touch buffer layer 610 and the first touch connection electrode 620.

The touch insulating layer 630 may include a hole to electrically connect the first touch electrode 640_R and the first touch connection electrode 620.

The touch insulating layer 630 may electrically insulate the second touch electrode and the second touch connection electrode 640_C.

The touch insulating layer 630 may be formed of a single layer or multiple layers of silicon nitride (SiNx) and/or silicon oxide (SiOx), but is not limited thereto.

The first touch electrode 640_R, the second touch electrode, and the second touch connection electrode 640_C may be disposed on the touch insulating layer 630.

The first touch electrode 640_R and the second touch electrode may be spaced apart from each other by a predetermined interval. At least one or more first touch electrodes 640_R adjacent in the first direction (or X-axis direction) may be spaced apart from each other. At least one first touch electrode 640_R adjacent in the first direction (or X-axis direction) may be connected to the first touch connection electrode 620 disposed between the plurality of first touch electrodes 640_R. For example, the plurality of adjacent first touch electrodes 640_R may be connected to the first touch connection electrode 620 through the hole in the touch insulating layer 630.

The second touch electrodes adjacent in the second direction (or Y-axis direction) may be connected by the second touch connection electrode 640_C. The second touch electrode and the second touch connection electrode 640_C may be formed on the same layer. For example, the second touch connection electrode 640_C may be disposed on the same layer as the second touch electrode and between a plurality of second touch electrodes. The second touch connection electrode 640_C may be formed to extend from the second touch electrode.

The first touch electrode 640_R, the second touch electrode, and the second touch connection electrode 640_C may be formed through the same process.

A touch planarization layer 650 may be disposed on the first touch electrode 640_R, the second touch electrode, and the second touch connection electrode 640_C.

A touch driving circuit may receive a touch sensing signal from the first touch electrode 640_R. Also, the touch driving circuit may transmit a touch driving signal to the second touch electrode. The touch driving circuit may detect a user's touch by using mutual capacitance between the plurality of first touch electrodes 640_R and the plurality of second touch electrodes. For example, when a touch operation is performed on the light emitting display apparatus 100, a capacitance change may occur between the first touch electrode 640_R and the second touch electrode. The touch driving circuit may detect a touch coordinate by detecting the capacitance change.

Hereinafter, an embodiment of the present disclosure is described with reference to FIG. 7.

Figure 7:
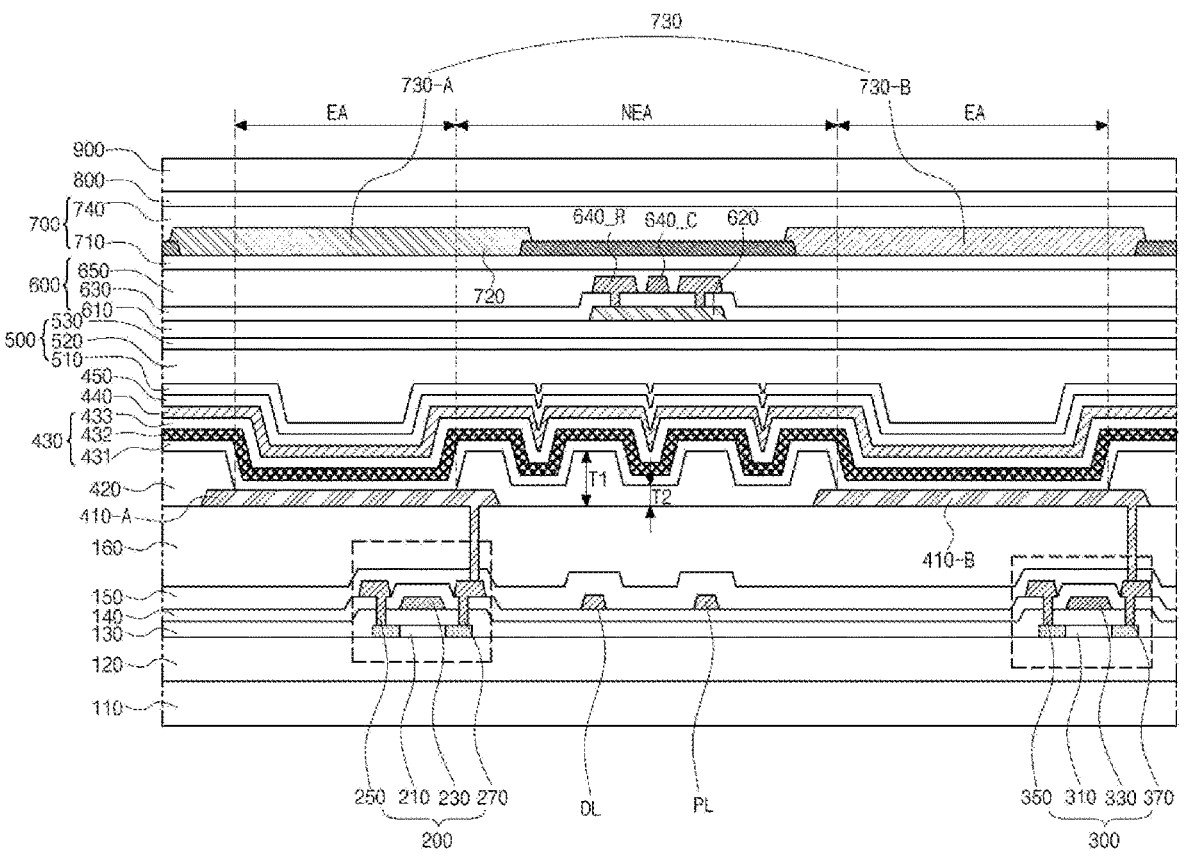
FIG. 7 is a cross-sectional view illustrating a color filter layer disposed on a substrate according to an embodiment of the present disclosure.

FIG. 7 is a cross-sectional view illustrating a color filter layer disposed on a substrate according to an embodiment of the present disclosure.

The light emitting display apparatus 100 shown in FIG. 7 is substantially the same as the display device of FIG. 6 except for a color filter layer 700, so that redundant explanations are omitted.

A color filter layer 700 may be disposed on the touch sensor layer 600.

When the light emitting display apparatus 100 is a top emission type, light emitted from the light emitting layer propagates toward an upper substrate and displays an image through a color filter 730. The color filter layer 700 may provide a display apparatus with improved color purity by disposing the same color as the color emitted from the light emitting layer of each subpixel in each subpixel. In addition, by disposing the color filter layer 700 adjacent to a second substrate, reflection of an external light can be reduced to improve light efficiency. In addition, since a polarizing plate is not used, cost can be reduced.

A color filter buffer layer 710 may be disposed on the touch planarization layer 650.

The color filter buffer layer 710 may block penetration of a chemical solution (e.g., developer, etching solution, etc.) used in the manufacturing process of the color filter layer or moisture from the outside into the light emitting element layer containing an organic material.

A black matrix 720 may be disposed on the color filter buffer layer 710.

The black matrix 720 is a black insulating layer and may be disposed between color filters 730 to prevent color mixing between adjacent color filters 730. Further, the black matrix 720 may prevent components from being viewed outside the light emitting display apparatus 100.

The black matrix 720 may overlap the bank 420. The width of the black matrix 720 may be smaller than that of the bank 420.

The color filter 730 may be disposed on the black matrix 720.

The color filter 730 may include a first color filter 730-A and a second color filter layer 730-B. The first color filter 730-A and the second color filter 730-B may be deposited on respective subpixels SP.

The first color filter 730-A and the second color filter 730-B may be formed to be spaced apart from each other between adjacent subpixels SP. For example, the first color filter 730-A and the second color filter 730-B may be deposited on the respective subpixels SP. At least a portion of the first color filter 730-A and the second color filter 730-B may be disposed on the black matrix 720, and a separation region between the first color filter 730-A and the second color filter 730-B B) may be formed on the black matrix 720.

The first color filter 730-A and the second color filter 730-B may have different colors. The first color filter 730-A and the second color filter 730-B may be formed of different ones of red, green, and blue dyes or pigments.

The first color filter 730-A may have the same color as light emitted from the first sub light emitting layer EML-1A or the third sub light emitting layer EML-2A, and the second color filter 730-B may have the same color as light emitted from the second sub light emitting layer EML-1B or the fourth sub light emitting layer EML-2B. For example, the first color filter 730-A may emit red or green light, and the second color filter 730-B may emit blue light.

Alternatively, the first color filter 730-A may have a color different from that of light emitted from the first sub light emitting layer EML-1A or the third sub light emitting layer EML-2A, and the second color filter 730-A B) may have a different color from that of light emitted from the second sub light emitting layer EML-1B or the fourth sub light emitting layer EML-2B.

The first color filter 730-A and the second color filter 730-B may at least partially overlap the black matrix 720. The first color filter 730-A and the second color filter 730-B may be disposed to cover at least a portion of the black matrix 720.

The first color filter 730-A and the second color filter 730-B may overlap at least a portion of the bank 420.

At least a portion of the first color filter 730-A and the second color filter 730-B may have a thickness greater than that of the black matrix 720.

An overcoat layer 740 may be disposed on the color filter 730 and the black matrix 720.

The overcoat layer 740 may be disposed to cover the color filter 730 and the black matrix 720.

The overcoat layer 740 may be formed of at least one or more of organic insulating materials such as benzocyclobutene (BCB), acrylic resin, epoxy resin, phenolic resin, polyamide resin and polyimide resin, but is not limited thereto.

An adhesive layer 800 may be disposed on the substrate on which the touch sensor layer 600 or the color filter layer 700 is disposed. For example, the adhesive layer 800 may bond (or attach) the touch sensor layer 600 or the color filter layer 700 to the second substrate 900.

The adhesive layer 800 may be made of an adhesive material. For example, the adhesive layer 800 may be made of OCA (Optical Clear Adhesive), PSA (Pressure Sensitive Adhesive), etc., but is not limited thereto.

The second substrate 900 may be disposed on the adhesive layer 800. The second substrate 900 may be made of glass or plastic material having flexibility.

For example, the second substrate 900 may be formed of at least one of polyimide (PI), polymethylmethacrylate (PMMA), polyethylene terephthalate (PET), polyether-sulfone, and polycarbonate, but is not limited thereto.

Although not shown in the drawings of the present disclosure, a layer including quantum dots (QDs) may be further included.

In the light emitting display apparatus according to the embodiment of the present disclosure, by disposing a bank including at least one protrusion, a lateral leakage current that increases as a distance between neighboring subpixels decreases can be blocked.

In the light emitting display apparatus according to the embodiment of the present disclosure, by disposing the light emitting element layer along the unevenness formed at the top surface of the bank, the distance that electrons move to neighboring subpixels is increased, so that electrons formed inside the light emitting element layer during driving can be prevented from moving to a neighboring subpixel.

In the light emitting display apparatus according to the embodiment of the present disclosure, a visibility defect in which neighboring pixels emit light at low gray levels can be solved, and color reproduction rate can be improved.

The effects of the present disclosure are not limited to the effects mentioned above, and other effects not mentioned are clearly understood by those skilled in the art from the description above.

A display apparatus according to an embodiment of the present disclosure may be described as follows.

A light emitting display apparatus according to an embodiment of the present disclosure may include a substrate including emitting portions and a non-emitting portion between the emitting portions, a first subpixel and a second subpixel disposed at the light emitting portions, first electrodes respectively disposed at the first subpixel and the second subpixel and disposed on the substrate, a bank disposed on the first electrodes and disposed at the non-emitting portion and including at least one protrusion protruded on an upper surface of the bank, a light emitting element layer disposed on the first electrodes of the emitting portions and the non-emitting portion and the bank, and including a plurality of light emitting units and a charge generation layer between the plurality of light emitting units, and a second electrode disposed on the light emitting element layer.

According to an embodiment of the present disclosure, a thickness of a region of the bank where the protrusion is provided is greater than thicknesses of other regions of the bank.

According to an embodiment of the present disclosure, a top surface of the bank may have unevenness.

According to an embodiment of the present disclosure, the light emitting element layer may be disposed along the unevenness of the top surface of the bank.

According to an embodiment of the present disclosure, driving voltages of the first subpixel and the second subpixel may be different from each other.

According to an embodiment of the present disclosure, a third subpixel may be further included, and at least two of distances between neighboring subpixels may be different from each other.

According to an embodiment of the present disclosure, a distance between a subpixel having the largest driving voltage among the first to third subpixels and another subpixel is smaller than a distance between the other subpixels.

According to an embodiment of the present disclosure, the charge generation layer may include a first charge generation layer and a second charge generation layer.

According to an embodiment of the present disclosure, the first charge generation layer may include one or more of an alkali metal of lithium (Li), sodium (Na), potassium (K) or cesium (Cs), and alkaline earth metal of magnesium (Mg), strontium (Sr), barium (Ba) or radium (Ra).

According to an embodiment of the present disclosure, the first charge generation layer may include an N-type dopant, and the second charge generation layer may include a P-type dopant.

According to an embodiment of the present disclosure, the plurality of light emitting units may include respective light emitting layers.

According to an embodiment of the present disclosure, at least one of the light emitting layers included in the plurality of light emitting units may emit blue light.

According to an embodiment of the present disclosure, the plurality of light emitting units may include at least three light emitting units, and the at least three light emitting units emit light of the same color.

According to an embodiment of the present disclosure, the at least three light emitting units may emit blue light.

According to an embodiment of the present disclosure, the light emitting layers may be disposed in each of the first subpixel and the second subpixel, and be spaced apart from each other.

According to an embodiment of the present disclosure, the light emitting layers disposed in each of the first subpixel and the second subpixel may emit light of the same color in the same subpixel.

According to an embodiment of the present disclosure, a data line and a power line disposed below the bank may be further included.

According to an embodiment of the present disclosure, the data line and the power line may overlap the protrusion of the bank.

According to an embodiment of the present disclosure, an encapsulation layer on the second electrode, and a touch sensor layer disposed on the encapsulation layer may be further included.

According to an embodiment of the present disclosure, a color filter layer disposed on the touch sensor layer may be further included.

According to an embodiment of the present disclosure, the color filter layer may include a black matrix and a color filter disposed on the black matrix.

According to an embodiment of the present disclosure, a thickness of the color filter may be greater than a thickness of the black matrix.

According to an embodiment of the present disclosure, the black matrix may overlap the bank According to an embodiment of the present disclosure, a width of the bank may be greater than a width of the black matrix.

According to an embodiment of the present disclosure, the color filter may include a first color filter disposed on the first subpixel and a second color filter disposed on the second subpixel, and the first color filter and the second color filter may be spaced apart from each other on the black matrix.

Although the embodiments of the present disclosure are described above in more detail with reference to the accompanying drawings, the present disclosure is not necessarily limited to these embodiments, and may be variously modified and implemented without departing from the technical idea of the present disclosure. Therefore, the embodiments disclosed in the present disclosure are not intended to limit the technical idea of the present disclosure, but to explain, and the scope of the technical idea of the present disclosure is not limited by these embodiments. Therefore, it should be understood that the embodiments described above are illustrative in all respects and not restrictive. The protection scope of the present disclosure may be construed according to the scope of the claims, and all technical ideas within the scope equivalent thereto should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:
a substrate including emitting portions and a non-emitting portion between the emitting portions;
a first subpixel and a second subpixel disposed in the emitting portions;
first electrodes respectively disposed at the first subpixel and the second subpixel and disposed on the substrate;
a bank disposed on the first electrodes and disposed on the non-emitting portion and including a plurality of protrusions that protrude upwardly on an upper surface of the bank;
a light emitting element layer disposed on the first electrodes of the emitting portions and on the bank, and including a plurality of light emitting units and a charge generation layer between two adjacent light emitting units of the plurality of light emitting units;
a second electrode disposed on the light emitting element layer; and
a data line and a power line disposed in the non-emitting portion between the emitting portions,
wherein the data line overlaps a first protrusion of the plurality of protrusions, and the power line overlaps a second protrusion of the plurality of protrusions, the second protrusion being adjacent to the first protrusion, and
wherein a width of the first protrusion is greater than that of the data line, and a width of the second protrusion is greater than that of the power line.

2. The light emitting display apparatus of claim 1, wherein a first thickness of a first region of the bank where the plurality of protrusions are provided is greater than a second thickness of a second region of the bank adjacent to the first region.

3. The light emitting display apparatus of claim 1, wherein a top surface of the bank has an uneven portion.

4. The light emitting display apparatus of claim 3, wherein the light emitting element layer is disposed along the uneven portion of the top surface of the bank.

5. The light emitting display apparatus of claim 1, wherein the first subpixel and the second subpixel are configured to have driving voltages different from each other.

6. The light emitting display apparatus of claim 1, further comprising a third subpixel,
wherein at least two of distances between neighboring subpixels of the first subpixel, the second subpixel and third subpixel are different from each other.

7. The light emitting display apparatus of claim 6, wherein among the first, second, and third subpixels, a distance between a subpixel configured to have largest driving voltage and another subpixel is smaller than a distance between other subpixels.

8. The light emitting display apparatus of claim 1, wherein the charge generation layer includes a first charge generation layer and a second charge generation layer.

9. The light emitting display apparatus of claim 8, wherein the first charge generation layer includes one or more of an alkali metal of lithium (Li), sodium (Na), potassium (K) or cesium (Cs), and alkaline earth metal of magnesium (Mg), strontium (Sr), barium (Ba) or radium (Ra).

10. The light emitting display apparatus of claim 8, wherein the first charge generation layer includes an N-type dopant, and the second charge generation layer includes a P-type dopant.

11. The light emitting display apparatus of claim 1, wherein the plurality of light emitting units include respective light emitting layers.

12. The light emitting display apparatus of claim 11, wherein at least one of the light emitting layers included in the plurality of light emitting units emits blue light.

13. The light emitting display apparatus of claim 11, wherein the plurality of light emitting units include at least three light emitting units, and
wherein the at least three light emitting units emit light of a same color.

14. The light emitting display apparatus of claim 13, wherein the at least three light emitting units emit blue light.

15. The light emitting display apparatus of claim 11, wherein the light emitting layers are disposed in each of the first subpixel and the second subpixel, and are spaced apart from each other.

16. The light emitting display apparatus of claim 15, wherein the light emitting layers are disposed in each of the first subpixel and the second subpixel and emit light of a same color in a same subpixel.

17. The light emitting display apparatus of claim 1, further comprising a touch sensor layer on the second electrode, and a color filter layer disposed on the touch sensor layer, the color filter layer including a black matrix and a color filter disposed on the black matrix, wherein a thickness of the color filter is greater than a thickness of the black matrix.

18. A light emitting display apparatus, comprising:
a substrate including emitting portions and a non-emitting portion positioned between the emitting portions;
a plurality of subpixels located at the emitting portions;
first electrodes respectively disposed at the plurality of subpixels and disposed on the substrate;
a bank disposed on the first electrodes and between adjacent subpixels, and including a plurality of protrusions that protrude upwardly on an upper surface of the bank;
a light emitting element layer disposed on the first electrodes of the emitting portions and on the bank, and including a plurality of light emitting units and a charge generation layer between two adjacent light emitting units of the plurality of light emitting units; and a second electrode disposed on the light emitting element layer, wherein an electron transfer path through which electrons move is formed in the light emitting element layer between the adjacent subpixels, wherein a length of the electron transfer path is longer than a distance between the adjacent subpixels, wherein a data line and a power line are disposed in the non-emitting portion between the emitting portions, wherein the data line overlaps a first protrusion of the plurality of protrusions, and the power line overlaps a second protrusion of the plurality of protrusions, the second protrusion being adjacent to the first protrusion, and wherein a width of the first protrusion is greater than that of the data line, and a width of the second protrusion is greater than that of the power line.

19. A light emitting display apparatus, comprising:

a substrate including emitting portions and a non-emitting portion between the emitting portions;

a plurality of subpixels disposed at the emitting portions, each of the plurality of subpixels comprises a first electrode, a bank disposed on the first electrodes and disposed at the non-emitting portion, the bank having different heights in a portion between two adjacent subpixels, and including a plurality of protrusions that protrude upwardly on an upper surface of the bank;

a light emitting element layer disposed on the portion of the bank, and including a charge generation layer;

a second electrode disposed on the light emitting element layer; and a data line and a power line disposed in the non-emitting portion between the emitting portions, wherein the data line overlaps a first protrusion of the plurality of protrusions, and the power line overlaps a second protrusion of the plurality of protrusions, the second protrusion being adjacent to the first protrusion, and wherein a width of the first protrusion is greater than that of the data line, and a width of the second protrusion is greater than that of the power line.

20. The display device of claim 1, wherein the data line and the power line do not overlap a region between the first protrusion and the second protrusion.

* * * * *